(12) United States Patent
Shikata et al.

(10) Patent No.: US 8,981,630 B2
(45) Date of Patent: Mar. 17, 2015

(54) CERAMICS SUBSTRATE FOR MOUNTING LIGHT-EMITTING ELEMENT AND LIGHT-EMITTING DEVICE

(75) Inventors: Kunihide Shikata, Satsumasendai (JP); Kazuhide Kusano, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 43 days.

(21) Appl. No.: 13/876,366

(22) PCT Filed: Sep. 28, 2011

(86) PCT No.: PCT/JP2011/072247
§ 371 (c)(1),
(2), (4) Date: Mar. 27, 2013

(87) PCT Pub. No.: WO2012/043659
PCT Pub. Date: Apr. 5, 2012

(65) Prior Publication Data
US 2013/0181593 A1    Jul. 18, 2013

(30) Foreign Application Priority Data
Sep. 29, 2010    (JP) .................................. 2010-219062

(51) Int. Cl.
*H01J 1/02* (2006.01)
*H01J 7/24* (2006.01)
(Continued)

(52) U.S. Cl.
CPC .............. *C04B 35/111* (2013.01); *H05B 33/02* (2013.01); *G02B 5/0242* (2013.01); *G02B 5/0247* (2013.01); *G02B 5/0284* (2013.01);
(Continued)

(58) Field of Classification Search
USPC .......... 313/46, 317; 257/E33.072, 79, 81, 98, 257/432, 433; 362/382
See application file for complete search history.

(56) References Cited

U.S. PATENT DOCUMENTS 8,207,077 B2    6/2012    Shikata et al.
8,450,761 B2*   5/2013    Kishimoto et al. ............. 257/98
(Continued)

FOREIGN PATENT DOCUMENTS

EP    2 460 783 A1    6/2012
JP    2002-234774 A   8/2002
(Continued)

OTHER PUBLICATIONS

Office Action dated Nov. 28, 2013, issued in counterpart Chinese Application No. 201180046312.0.
(Continued)

*Primary Examiner* — Thomas A Hollweg
(74) *Attorney, Agent, or Firm* — Procopio, Cory, Hargreaves & Savitch, LLP

(57) ABSTRACT

A ceramics substrate for mounting a light-emitting element includes a ceramic sintered body, the ceramic sintered body having a mounting section on which a light-emitting element is mounted, in a surface portion on a mounting section side of the ceramic sintered body, a ratio of crystal grains having a crystal grain size of 0.2 μm to 1.0 μm in equivalent circle diameter being in a range of 45% to 80%, a ratio of crystal gains having a crystal grain size of 2.0 μm to 6.0 μm in equivalent circle diameter being in a range of 5% to 15%, and a ratio of crystal grains having a crystal grain size of more than 6.0 μm in equivalent circle diameter being 2.7% or less.

6 Claims, 3 Drawing Sheets

(51) Int. Cl.
*H01J 61/52* (2006.01)
*H01K 1/58* (2006.01)
*C04B 35/111* (2006.01)
*H05B 33/02* (2006.01)
*G02B 5/02* (2006.01)
*C04B 35/46* (2006.01)
*C04B 35/486* (2006.01)
*H01L 33/48* (2010.01)
*H01L 33/60* (2010.01)
*H01L 33/64* (2010.01)
*H05K 1/03* (2006.01)

(52) U.S. Cl.
CPC .............. *C04B 35/46* (2013.01); *C04B 35/486* (2013.01); *H01L 33/486* (2013.01); *H01L 33/60* (2013.01); *H01L 33/641* (2013.01); *H05K 1/0306* (2013.01); *H05K 2201/10106* (2013.01); *H01L 2224/32225* (2013.01); *H01L 2224/48091* (2013.01); *H01L 2224/48227* (2013.01); *H01L 2224/73265* (2013.01); *H01L 2224/32013* (2013.01); *C04B 2235/3206* (2013.01); *C04B 2235/3208* (2013.01); *C04B 2235/3217* (2013.01); *C04B 2235/3418* (2013.01); *C04B 2235/36* (2013.01); *C04B 2235/5436* (2013.01); *C04B 2235/782* (2013.01); *C04B 2235/785* (2013.01); *C04B 2235/786* (2013.01); *C04B 2235/85* (2013.01); *C04B 2235/9607* (2013.01); *C04B 2235/9646* (2013.01)

USPC ........ 313/46; 313/317; 257/E33.072; 257/79; 257/81; 257/98; 257/432; 257/433; 362/382

(56) References Cited

U.S. PATENT DOCUMENTS

| | | | |
|---|---|---|---|
| 2003/0020887 | A1 | 1/2003 | Hasegawa |
| 2009/0152581 | A1* | 6/2009 | Kishimoto et al. ............. 257/98 |
| 2012/0025255 | A1* | 2/2012 | Kishimoto et al. ............. 257/98 |
| 2013/0065067 | A1 | 3/2013 | Nishimura et al. |
| 2013/0134859 | A1* | 5/2013 | Imakita ........................ 313/317 |

FOREIGN PATENT DOCUMENTS

| | | | |
|---|---|---|---|
| JP | 2005-053758 | * | 3/2005 |
| JP | 2005-179147 | A | 7/2005 |
| JP | 2007-121613 | A | 5/2007 |
| JP | 2007-284333 | A | 11/2007 |
| JP | 2009-162950 | A | 7/2009 |
| WO | 2007/058361 | A1 | 5/2007 |
| WO | 2009/057603 | A1 | 5/2009 |
| WO | 2011/152363 | A2 | 12/2011 |

OTHER PUBLICATIONS

Extended European Search Report dated Feb. 12, 2014 for European Patent Application No. 11829212.7.
International Search Report dated Dec. 20, 2011, issued for International Application No. PCT/JP2011/072247.

* cited by examiner

CERAMICS SUBSTRATE FOR MOUNTING LIGHT-EMITTING ELEMENT AND LIGHT-EMITTING DEVICE

TECHNICAL FIELD

The present invention relates to a ceramics substrate for mounting a light-emitting element and a light-emitting device in which a light-emitting element is mounted on the ceramics substrate for mounting a light-emitting element.

BACKGROUND ART

Recently, an LED (Light Emitting Diode) has attracted attention as a light-emitting element with high brightness and low power consumption which can be mass-produced. LEDs have been widely used for general illuminations, a light source of an electronic display board and a backlight of a mobile phone, a computer, a television, and the like.

A substrate itself for mounting such a light-emitting element is required to have high reflectance to enhance heat dissipation performance.

In response to this requirement, Patent Literature 1 discloses that light reflectance at a wavelength of 400 to 740 nm is in the range of 90% to 93%, in that a high-reflectance white ceramics substrate for a semiconductor light-emitting element is formed of aluminum oxide and a glassy component to have porosity of 5%, the content of aluminum oxide is in the range of 75 to 85 wt %, silica, calcium, magnesium, and barium are contained as the glassy component, and the average crystal grain size of aluminum oxide is 0.5 µm or less.

CITATION LIST

Patent Literature

Patent Literature 1: Japanese Unexamined Patent Publication JP-A 2007-284333

SUMMARY OF INVENTION

Technical Problem

However, the high-reflectance white ceramics for a semiconductor light-emitting element disclosed in Patent Literature 1 is, for example, a sintered body containing alumina of 75 to 85 wt % and silica and barium, calcium, and magnesium oxides of about 25 to 15 wt % as the glassy component, and the reflectance thereof at a wavelength of 400 to 740 nm is 90% or more. However, since the crystal grain size of alumina is 0.5 µm or less, there is a problem in that the thermal conductivity thereof is lowered and the effect of cooling a light-emitting element is lowered to shorten the lifetime of the light-emitting element.

The invention is made to solve the above-mentioned problems and an object thereof is to provide a ceramics substrate for mounting a light-emitting element having high thermal conductivity which can achieve high reflectance and which can enhance heat dissipation performance to extend the lifetime of a light-emitting element.

Solution to Problem

According to an aspect of the invention, there is provided a ceramics substrate for mounting a light-emitting element comprising a ceramic sintered body, the ceramic sintered body having a mounting section on which the light-emitting element is mounted, in a surface portion on a mounting section side of the ceramic sintered body, a ratio of crystal grains having a crystal grain size of 0.2 µm to 1.0 µm in equivalent circle diameter being in a range of 45% to 80%, a ratio of crystal gains having a crystal grain size of 2.0 µm to 6.0 µm in equivalent circle diameter being in a range of 5% to 15%, and a ratio of crystal grains having a crystal grain size of more than 6.0 µm in equivalent circle diameter being 2.7% or less.

According to another aspect of the invention, there is provided a light-emitting device comprising the ceramics substrate for mounting a light-emitting element mentioned above.

Advantageous Effects of Invention

Since the ceramics substrate for mounting a light-emitting element according to the invention is a ceramics substrate for mounting a light-emitting element comprising a ceramic sintered body, the ceramic sintered body having a mounting section on which the light-emitting element is mounted, in a surface portion on a mounting section side of the ceramic sintered body, a ratio of crystal grains having a crystal grain size of 0.2 µm to 1.0 µm in equivalent circle diameter being in a range of 45% to 80%, a ratio of crystal gains having a crystal grain size of 2.0 µm to 6.0 µm in equivalent circle diameter being in a range of 5% to 15%, and a ratio of crystal grains having a crystal grain size of more than 6.0 µm in equivalent circle diameter being 2.7% or less, it is easy to maintain high reflectance and high thermal conductivity.

By employing the light-emitting device in which a light-emitting element is mounted on the ceramics substrate for mounting a light-emitting element having the above-mentioned configuration, it is possible to achieve high reflectance, to enhance heat dissipation performance of the light-emitting element, and thus to extend the lifetime thereof.

DESCRIPTION OF EMBODIMENTS

Hereinafter, an example of a ceramics substrate for mounting a light-emitting element according to an embodiment of the invention will be described.

Figure 1:
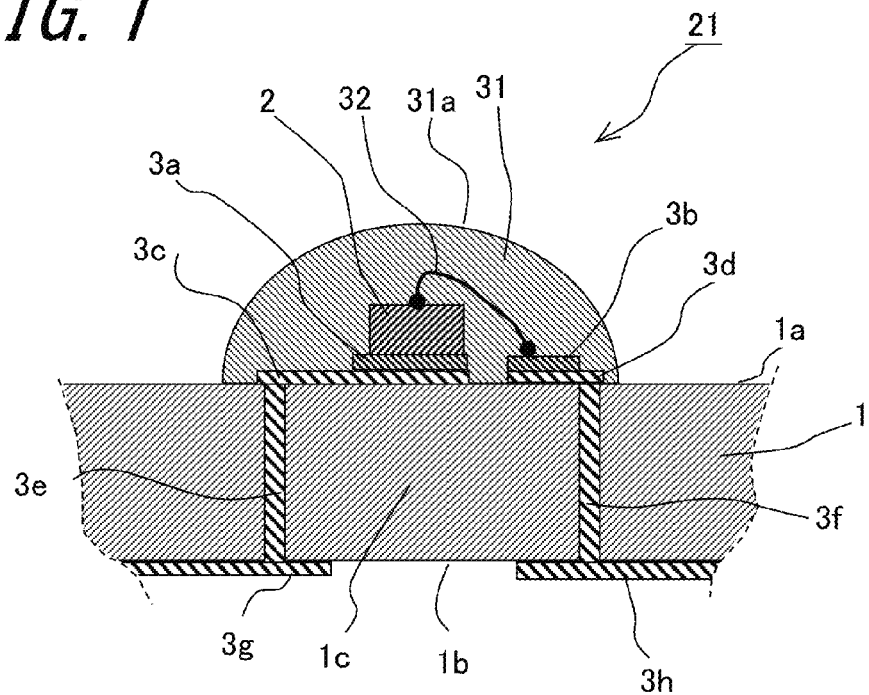
FIG. 1 is a cross-sectional view illustrating an example of a configuration of a light-emitting device in which a light-emitting element is mounted on a ceramics substrate for mounting a light-emitting element according to an embodiment.

FIG. 1 is a cross-sectional view illustrating an example of a configuration of a light-emitting device in which a light-emitting element is mounted on a ceramics substrate for mounting a light-emitting element according to an embodiment.

In a light-emitting device 21 employing a ceramics substrate 1 for mounting a light-emitting element (hereinafter, referred to as a substrate 1) according to the embodiment, electrodes (front electrodes) 3c and 3d are bonded to one surface 1a of the substrate 1 on which a light-emitting element 2 is mounted using a thick film printing method or the like, electrode pads 3a and 3b are formed in parts of the electrodes 3c and 3d by plating or the like, and the light-emitting element 2 formed of semiconductor is mounted on the electrode pad 3a. The light-emitting element 2 and the electrode pad 3b are electrically connected to each other by the use of a bonding wire 32. Here, the bonding of the electrode pad 3a and the light-emitting element 2 is not particularly limited as long as both can be electrically connected. For example, bonding using a conductive adhesive, bonding using a bonding wire 32, or bonding using a solder bump may be used. The light-emitting element 2 and the electrodes 3c and 3d including the electrodes pads 3a and 3b are covered with a sealing member 31 formed of a resin or the like. The sealing member 31 has both a function of protecting the light-emitting element 2 and a function of a lens 31a. In general, transparent overcoat glass is formed as a protective layer on exposed portions of the electrodes 3c and 3d and the electrode pads 3a and 3b, which is not described herein.

The electrodes (front electrodes) 3c and 3d are electrically connected to electrodes (rear electrodes) 3g and 3h formed on the other surface 1b via electrodes (penetrating conductive layers) 3e and 3f penetrating the substrate 1.

By connecting an external DC power source (not shown) or an AC-DC switching power source (not shown) to the electrodes (rear electrodes) 3g and 3h and applying a voltage thereto, the light-emitting element 2 emits light. In many cases, the sealing member 31 has a function of selectively converting a wavelength of light in addition to a function of protecting the light-emitting element 2, and has a structure in which light is diffused and radiated through the use of the lens 31a which is an outer shell of the sealing member 31.

Figure 2:
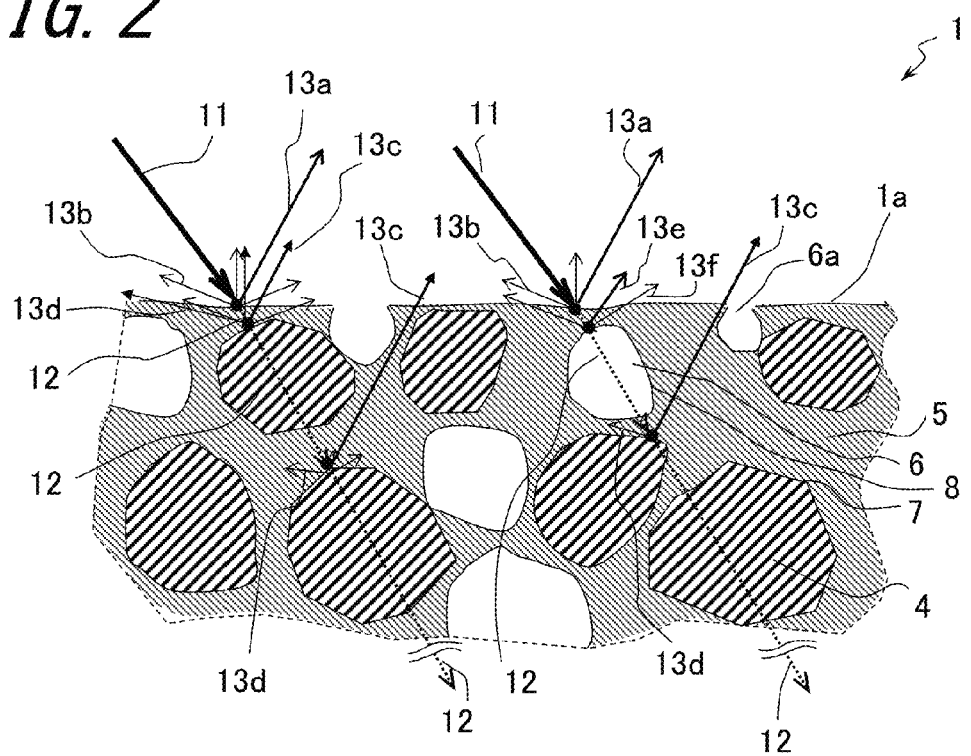
FIG. 2 is a conceptual diagram illustrating a state where light incident on a surface of the ceramics substrate for mounting a light-emitting element according to the embodiment is scattered.

FIG. 2 is a conceptual diagram illustrating a state where light incident on the surface of the ceramics substrate for mounting a light-emitting element according to the embodiment is scattered.

As shown in FIG. 2, the ceramics substrate 1 for mounting a light-emitting element according to the embodiment includes crystal grains 4, glass phases (grain boundary phases) 5 formed of silica or the like, and pores 6 when the cross-section is seen at the level of crystal grain size. An interface 7 is defined between the crystal grains 4 and the glass phases 5, and an interface 8 is defined between the pores 6 and the glass phases 5.

Incident light 11 applied to the surface 1a of the ceramics substrate 1 for mounting a light-emitting element according to the embodiment becomes reflected light 13 that is reflected by the surface 1a of the substrate 1 and transmitted light 12 that passes through the inside of the substrate 1 and exits from the opposite surface of the surface 1a to which the incident light 11 is applied.

A part of the incident light 11 becomes specularly-reflected light 13a that is reflected in the opposite direction at the same angle as the incidence angle to the surface 1a and diffusely-reflected light 13b that is reflected in an unspecified direction on the surface 1a, and the other of the incident light travels in the substrate 1. A part of the light traveling in the substrate 1 becomes specularly-reflected light 13c and diffusely-reflected light 13d at the interface 7 between the crystal grains 4 and the glass phases 5 in the substrate 1 and becomes specularly-reflected light 13e and diffusely-reflected light 13f at the interface 8 between the pores 6 and the glass phases 5, and the other light further travels in the substrate 1, forms specularly-reflected light 13e and diffusely-reflected light 13f at the interface 7 between the crystal grains 4 and the glass phases 5 and the interface 8 between the pores 6 and the glass phases 5, and becomes reflected light from the surface 1a. The light traveling in the substrate 1 exits as transmitted light 12 from the opposite surface. In order to enhance light reflectance of the substrate 1, it is necessary to increase the amount of specularly-reflected light 13c, 13e and the amount of diffusely-reflected light 13d, 13f in the substrate 1 so as to be reflected to the surface 1a or to decrease the amount of transmitted light 12 exiting from the other surface 1b.

Open pores 6a are present on the surfaces 1a and 1b, but the ratio of the area of the open pores 6a to the surface area is small and thus the influence thereof on reflected light 13 will not be described.

Figure 3:
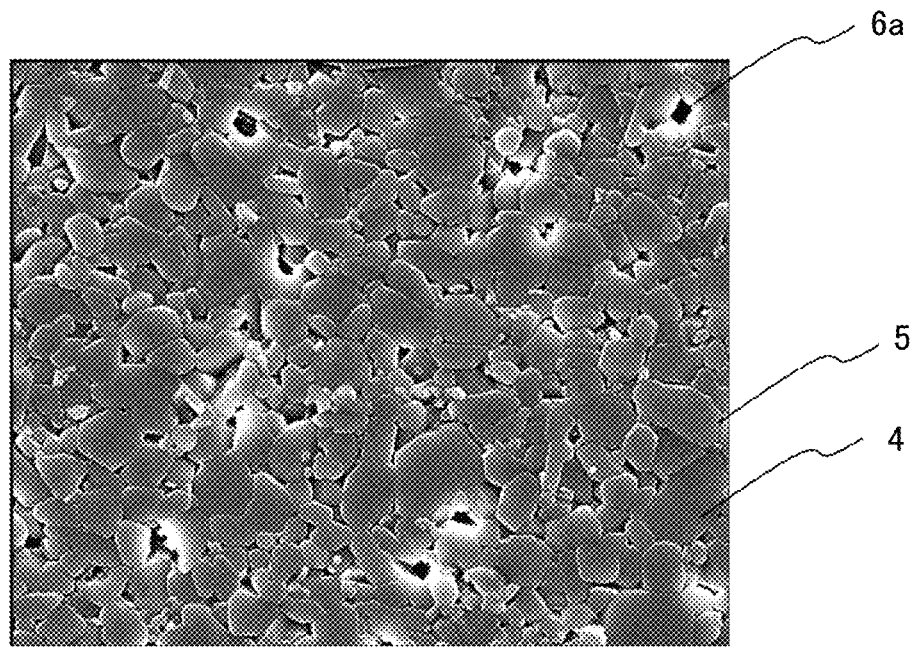
FIG. 3 is an electron microscope photograph illustrating crystal grains of the ceramics substrate for mounting a light-emitting element according to the embodiment.

FIG. 3 is an electron microscope photograph illustrating crystal grains of the ceramics substrate for mounting a light-emitting element according to the embodiment.

The electron microscope photograph showing the crystal grains is obtained by capturing an image with a scanning electron microscope after performing a mirror-like finishing process and a fire etching process on the surface of the substrate 1.

As shown in FIG. 3, the crystal grains 4, the glass phases (grain boundary phases) 5, and the open pores 6a formed by allowing the pores 6 formed in the course of sintering ceramics to appear on the surface or detaching crystal grains from the surface in the course of processing are present on the surface of the substrate 1 according to the embodiment.

The ceramics substrate 1 for mounting a light-emitting element according to the embodiment includes a ceramic sintered body, the ceramic sintered body having a mounting section on which the light-emitting element is mounted. It is important that, in a surface portion on the mounting section side of the ceramic sintered body, a ratio of the number of crystal grains having a crystal grain size of 0.2 μm to 1.0 μm in terms of an equivalent circle diameter is in the range of 45% to 80%, a ratio of the number of crystal gains having a crystal grain size of 2.0 μm to 6.0 μm in terms of an equivalent circle diameter is in the range of 5% to 15%, and a ratio of the number of crystal grains having a crystal grain size of more than 6.0 μm in terms of an equivalent circle diameter is 2.7% or less.

Here, the mounting section of the ceramics substrate 1 for mounting a light-emitting element according to the embodiment on which the light-emitting element is mounted means the surface 1a of the substrate 1 which is a surface on which the electrodes 3c and 3d to be mounted with the light-emitting element are formed, and the surface portion means a portion of the surface layer ranging about 50 μm in the thickness direction from the surface 1a of the substrate 1.

The substrate 1 according to the embodiment includes a ceramic sintered body having the mounting section of the substrate 1 on which the light-emitting element is mounted, and, in the surface portion on the mounting section side of the ceramic sintered body, the ratio of the number of crystal grains having a crystal grain size of 0.2 μm to 1.0 μm in terms of an equivalent circle diameter is in the range of 45% to 80%. Accordingly, as shown in FIG. 2, the amount of interface 7 between the crystal grains 4 and the glass phases 5 which reflects incident light 11 increases and the amounts of specularly-reflected light 13c and diffusely-reflected light 13d increase, thereby easily achieving high reflectance. It is possible to reduce scattering of phonon, which is the vibration of the crystal lattice conducting heat, from the interface 7 and thus to maintain high thermal conductivity.

In the substrate 1 according to the embodiment, since the ratio of the number of crystal gains having a crystal grain size of 2.0 µm to 6.0 µm in terms of an equivalent circle diameter is in the range of 5% to 15%, it is possible to achieve high reflectance and to easily maintain high thermal conductivity of the substrate 1. When the crystal grain size increases, the crystal grain can easily absorb or attenuate short wavelengths. Accordingly, the substrate 1 in which ratio of the number of crystal gains having a crystal grain size of 2.0 µm to 6.0 µm in terms of an equivalent circle diameter is in the range of 5% to 15% can suppress absorption or attenuation of short-wavelength components of visible light due to the crystal grains. Therefore, it is possible to achieve high reflectance at all the wavelengths of visible light.

Since the amount of interface 7 between the crystal grains 4 and the glass phases 5 decreases in comparison with the ceramics substrate for mounting a light-emitting element including crystal grains having a crystal grain size of 1.0 µm or less, it is possible to reduce scattering of the phonon which is the vibration of crystal grains conducting heat and to easily maintain high thermal conductivity. In addition, it is easy to suppress the problem in that reflectance of visible light is lowered due the decrease of the amount of interface 7 between the crystal grains 4 and the glass phases 5.

When the ratio of the number of crystal gains having a crystal grain size of 2.0 µm to 6.0 µm in terms of an equivalent circle diameter is in the range of 5% to 15% and a plate-like member in which division grooves dividing the plate-like member into individual pieces are formed on the surface of the substrate 1 is used, burrs are not formed well on the division planes dividing the plate-like member along the division grooves. It is thought that this is because since the substrate 1 includes crystal gains having a crystal grain size of 2.0 µm to 6.0 µm in terms of an equivalent circle diameter in the range of 5% to 15%, fracture sources such as pores are appropriately dispersed in the substrate 1 and cracks generated from the division grooves go straightly. Particularly, when the three-point bending strength of the substrate 1 is in the range of 280 to 400 MPa, burrs do not remain well and chips are not formed well at an end of the substrate 1 during the manufacturing process.

Since the ratio of the number of crystal grains having a crystal grain size of more than 6.0 µm in terms of an equivalent circle diameter, which are large crystal grains easily absorbing or attenuating short wavelengths, is suppressed to be 2.7% or less, it is possible to further suppress absorption and attenuation of short-wavelength components of visible light by the crystal grains and thus to achieve high reflectance.

In measurement of the crystal grain size, a crystal grain size distribution can be obtained by performing a mirror-like finishing process on the surface of the substrate 1, performing a fire etching process thereon in a temperature range lower 50° C. to 100° C. than the firing temperature, capturing an image at a magnification of 1000 to 3000 times with a scanning electron microscope (for example, JSM-7001F made by JEOL Ltd.) to prepare image data, calculating the area of each crystal grain using an image analyzer (for example, Win ROOF made by MITANI Corporation), and calculating the equivalent circle diameter of each crystal grain from the calculated area.

In the embodiment, crystal grains having a crystal grain size of less than 0.2 µm may be included in the substrate 1, but the crystal grains having a crystal grain size of less than 0.2 µm cannot be detected in the crystal grain size measuring method used in the embodiment and thus are not described.

The light reflectance of the substrate 1 according to the embodiment can be measured by using a spectral photometer (for example, a spectral photometer with a model name of UV-315 and an integral sphere unit with a model name of ISR-3100, made by Shimadzu Corporation) employing an integral sphere unit, using a 50 W halogen lamp and a deuterium lamp as a light source, setting the wavelength range to 200 to 1000 nm, setting the measurement range to diffuse reflectance (7×9 mm with a slit of 20 nm), and using barium sulfate powder as the standard without using a mask.

The thermal conductivity can be measured by processing the substrate 1 in a thickness of 2 mm and using a laser flash method (for example, TC-7000 made by Shinku Riko Kabushiki Kaisha).

The three-point bending strength can be measured in accordance with JIS R 1601. However, when the substrate 1 is a plate-like member, the strength can be calculated using a three-point bending strength calculating expression, for example, by using a sintered body having a sample shape having a length of about 40 mm, a width of 25 mm, and a thickness of 0.5 to 0.8 mm, setting the surface of the sintered body to a fired surface, setting the span of a fulcrum to 30 mm, and applying a load to the center of the span at a speed of 0.5 mm/min.

It is preferable that the ceramic sintered body of the ceramics substrate for mounting a light-emitting element according to the embodiment is formed of white ceramics containing aluminum oxide ($Al_2O_3$), zirconium oxide ($ZrO_2$), or titanium oxide ($TiO_2$) as a major component. By using this white ceramics, it is possible to achieve high reflectance. Among these, the use of aluminum oxide can achieve high thermal conductivity. Here, the major component means that the ratio of the sum mass of aluminum oxide, zirconium oxide, or titanium oxide to the total mass of the ceramic sintered body is 94 mass % or more.

It is preferable that the substrate 1 according to the embodiment contains 94 mass % or more of aluminum oxide.

When the substrate 1 according to the embodiment contains 94 mass % or more of aluminum oxide, it is possible to maintain high reflectance without lowering the thermal conductivity. When the content of aluminum oxide is less than 94 mass %, the amount of component forming a glass phase which is a sintering agent increases. Therefore, incident light can easily pass through the substrate 1 to the rear surface, thereby easily lowering the reflectance. Since the thermal conductivity of the glass phase is low, the increase in the amount of glass phase can easily lower the thermal conductivity of the substrate.

In the ceramics substrate 1 for mounting a light-emitting element according to the embodiment, since the content of aluminum oxide is 94 mass % or more, the total content of silicon oxide and at least one of calcium oxide and magnesium oxide other than inevitable impurities added as a sintering agent is equal to or less than 6 mass % of the balance (which does not include 0) and the substrate can be fired at a temperature lower than a normal firing temperature to suppress the manufacturing cost thereof, but the substrate may include other compounds. For example, when a barium compound is added thereto, the barium compound is present in the grain boundary phase 5, thereby further improving the reflectance.

The glass phase 5 formed of silicon oxide or the like is formed between the crystal grains 4. Accordingly, when a thick film paste for forming the electrodes 3c and 3d is applied to the surface 1a of the substrate 1 on which the light-emitting element 2 is mounted and is subjected to thick film firing, a metal component included in the paste diffuses from the surface 1a to the inside via the glass phase 5 and it is thus possible to easily enhance the adhesion strength between the electrodes 3c and 3d and the substrate 1.

In order to efficiently reflect incident light 11, the amount of specularly-reflected light 13c and the amount of diffusely-reflected light 13d at the interface 7 between the crystal grains 4 and the glass phases 5 can be increased to easily enhance the reflectance. In addition, the amount of specularly-reflected light 13c and the amount of diffusely-reflected light 13d at the interface 8 between the pores 6 and the glass phases 5 can be similarly increased to easily raise the reflectance.

In the ceramics substrate 1 for mounting a light-emitting element according to the embodiment, it is preferable that the maximum value of the crystal grain size is 6.0 μm or less.

When the maximum value of the crystal grain size is 6.0 μm or less and the substrate 1 is formed therewith, the specularly-reflected light 13c and the diffusely-reflected light 13d which are obtained by reflecting the light traveling in the substrate 1 at the interface 7 between the crystal grains 4 and the glass phases 5 have more chances of reflection. Accordingly, since the light can pass through the glass phases 5 and easily exit as reflected light from the surface 1a of the substrate 1, the reflectance is not lowered well.

In the ceramics substrate 1 for mounting a light-emitting element according to the embodiment, it is preferable that the average crystal grain size is in the range of 0.7 μm to 1.3 μm in terms of the equivalent circle diameter.

In the substrate 1 according to the embodiment, as described above, when the conditions that the ratio of the number of crystal grains having a crystal grain size of 0.2 μm to 1.0 μm is in the range of 45% to 80%, the ratio of the number of crystal gains having a crystal grain size of 2.0 μm to 6.0 μm is in the range of 5% to 15%, and the ratio of the number of crystal grains having a crystal grain size of more than 6.0 μm is in the range of 2.7% or less are satisfied and the average crystal grain size is in the range of 0.7 μm to 1.3 μm, it is possible to further easily improve the effect of enhancing both characteristics of reflectance of visible light and thermal conductivity.

Figure 4:
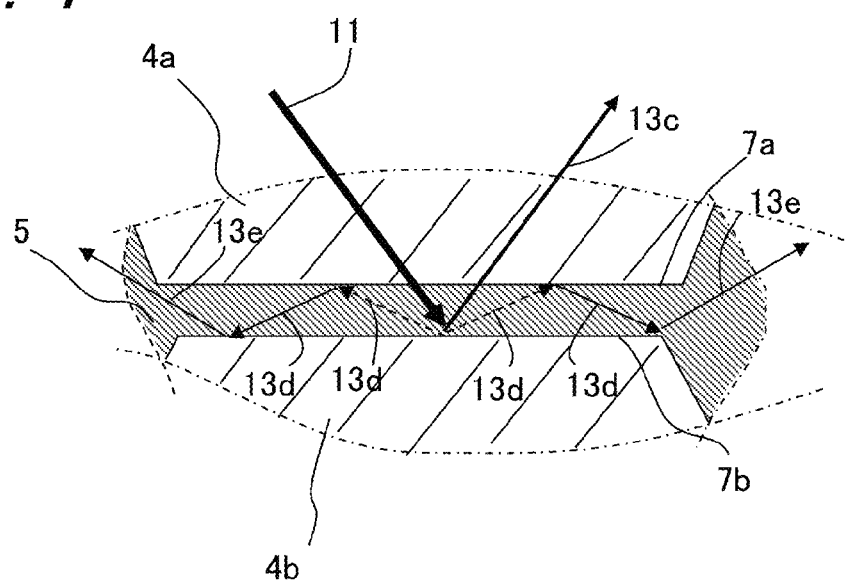
FIG. 4 is a conceptual diagram illustrating a state where diffusely-reflected light is scattered between the grain boundary phases in the ceramics substrate for mounting a light-emitting element according to the embodiment.

FIG. 4 is a conceptual diagram illustrating a state where a part of diffusely-reflected light is scattered between the grain boundary phases in the ceramics substrate 1 for mounting a light-emitting element according to the embodiment.

As shown in FIG. 4, the ceramics substrate 1 for mounting a light-emitting element according to the embodiment includes crystal grains 4, grain boundary phases 5 formed of silicon oxide or the like, and pores (not shown), when the cross-section is seen at the level of crystal grain size (Since the state where incident light 11 is scattered has been described with reference to FIG. 2, diffusely-reflected light in the grain boundary phases between the crystal grains will be described below.)

Incident light 11 applied to the surface of the ceramics substrate 1 for mounting a light-emitting element according to the embodiment becomes light traveling in the substrate 1, further travels inside an interface 7a between a crystal grain 4a and the grain boundary phase 5 in the substrate 1, and travels to an interface 7b between a neighboring crystal grain 4b and the grain boundary phase 5. In the course of traveling of light, a part of light becomes specularly-reflected light 13c obtained by reflecting the light in the opposite direction at the same angle as the incidence angle and diffusely-reflected light 13d. The diffusely-reflected light 13d is repeatedly reflected in the grain boundary phase 5 between the interface 7a and the interface 7b and exits as diffusely-reflected light 13e from the surface (not shown) of the substrate 1.

In the ceramics substrate 1 for mounting a light-emitting element according to the embodiment, it is preferable that the average width of the grain boundary phase formed between the crystal grains is 2 nm or less.

In the ceramics substrate 1 for mounting a light-emitting element according to the embodiment, when the average width of the grain boundary phase 5 of the substrate 1 is 2 nm or less, the grain boundary phase 5 is present between the interface 7a and the interface 7b of the neighboring crystal grains 4a and 4b, for example, in FIG. 4. Accordingly, when light enters the grain boundary phase 5, the reflection of light is repeated between the interface 7a and the interface 7b, the amount of diffusely-reflected light 13d increases, and the reflectance can be easily raised. When the average width of the grain boundary phase 5 is more than 2 nm, the width of the grain boundary phase 5 increases, thus the number of reflection times of light between the interface 7a and the interface 7b decreases, the amount of diffusely-reflected light 13d decreases, and the enhancement of reflectance can be easily suppressed.

Here, the technique of calculating the average width of the grain boundary phase 7 formed between the crystal grains is as follows.

Figure 5:
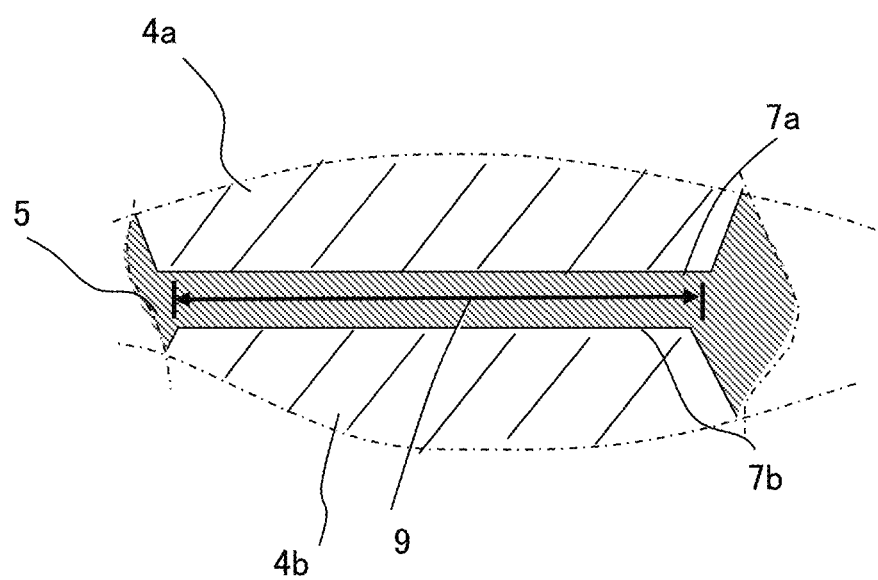
FIG. 5 is a conceptual diagram illustrating crystal grains and grain boundary phases formed between the crystal grains in a ceramics substrate for mounting a light-emitting element according to the embodiment.

FIG. 5 is a conceptual diagram illustrating the crystal grains 4a and 4b and the grain boundary phase 5 formed between the crystal grains 4a and 4b in the ceramics substrate 1 for mounting a light-emitting element according to the embodiment.

A cross-section of the substrate 1 is enlarged to a magnification of 40000 to 60000 times through the use of TEM observation and the width of the grain boundary phase is measured in the range 9 of the grain boundary phase 5 formed between the crystal grains 4a and 4b. The same measurement is performed on a viewing field of ten positions and the average thereof can be defined as the average width of the grain boundary phase.

In a light-emitting device according to the embodiment, a light-emitting element is mounted on the ceramics substrate for mounting a light-emitting element.

When a light-emitting element is mounted on the substrate 1 according to the embodiment and the light-emitting element emits light, light is efficiently reflected from the surface of the substrate 1 and it is thus possible to provide a light-emitting device having high brightness with low power. In addition, since the thermal conductivity is high, the heat dissipation performance is superior and degradation of the light-emitting element, the reflecting material, the resin covering the light-emitting element, and the like can be easily suppressed, thereby extending the lifetime thereof.

An example of a method of manufacturing the ceramics substrate for mounting a light-emitting element according to the embodiment will be described below.

For example, when the ceramic sintered body contains aluminum oxide as a major component, 94 mass % or more of powder of aluminum oxide ($Al_2O_3$) having an average grain size of 1.8 μm as a raw material and 6 mass % or less in total of powder of silicon oxide ($SiO_2$) and at least one of calcium oxide (CaO) and magnesium oxide (MgO) as a sintering agent are prepared. Aluminum oxide and the sintering agent are weighed to be 100 mass % in total. Here, by adjusting the weighing of the sintering agent, it is possible to adjust the average width of the grain boundary phase 5 formed between the crystal grains.

Aluminum oxide is selected as the sintering agent when the ceramic sintered body contains zirconium oxide as a major component, at least one of silicon oxide and aluminum oxide is selected as the sintering agent when the ceramic sintered body contains titanium oxide as a major component, and the weighing can be performed such that the major component is 94 mass % or more and the balance is the sintering agent.

For example, when the amount of aluminum oxide is set to 94 mass % and the amount of sintering agent is set to 6 mass %, the amount of aluminum oxide is divided into 60 mass % and 34 mass % and the resultants are individually pulverized using a tumbling mill or a bead mill along with a solvent such as water and using high-purity alumina balls, thereby obtaining slurries. In the tumbling mill to which 60 mass % of aluminum oxide is input, the grain size measured by the use of a laser diffraction scattering method (for example, Microtrac 9320-X100 made by Nikkiso Co., Ltd.) is set to D50=1.2 more or less. In the tumbling mill to which 34 mass % of aluminum oxide is input, the grain size measured by the use of the same laser diffraction scattering method is set to D50=1.6 more or less.

These slurries are input to the tumbling mill or the like along with the pulverized sintering agents and are further mixed for several hours. By dividing aluminum oxide into two or more species, pulverizing the resultants to form slurries having different grain sizes, and mixing the slurries, it is possible to adjust the crystal grain size of the substrate 1.

A sheet is formed using these slurries by the use of a doctor blade method or a ceramics sheet is formed using powder prepared from these slurries through the use of a spray drier and by the use of a known powder press molding method or a known roll compaction method, and an unfired compact is formed through the use of a molding process or laser process for forming a product shape. At this time, it is preferable that the compact is a segmentable compact in consideration of mass productivity. Then, by firing the resultant compact in the highest temperature range of 1420° C. to 1650° C. when the major component is aluminum oxide, in the highest temperature range of 1350° C. to 1550° C. when the major component is zirconium oxide, and in the highest temperature range of 1200° C. to 1400° C. when the major component is titanium oxide by the use of an atmosphere (oxidizing atmosphere) firing furnace (such as a roller-type tunnel kiln, a batch-type atmosphere kiln, and a pusher-type tunnel kiln), it is possible to manufacture the ceramics substrate 1 for mounting a light-emitting element according to the embodiment. The highest firing temperature can be appropriately adjusted depending on the mass of the major component. The crystal grain size and the average width of the grain boundary phase 5 may be adjusted by adjusting the firing time.

Example 1

Examples of the invention will be specifically described below, but the invention is not limited to the following examples.

First, 94 mass % of powder of aluminum oxide ($Al_2O_3$) with an average grain size of 1.8 μm, 3.5 mass % of powder of silicon oxide ($SiO_2$), 1.5 mass % of powder of calcium oxide (CaO), and 1.0 mass % of powder of magnesium oxide (MgO) as a sintering agent were prepared. Aluminum oxide and the sintering agent were weighed to be 100 mass % in total.

Then, the amount of aluminum oxide was divided into 60 mass % and 34 mass % such that the amount of aluminum oxide is 94 mass % and the amount of sintering agent is 6 mass %, and the resultants were individually pulverized using a tumbling mill along with a solvent such as water and using high-purity alumina balls, thereby obtaining slurries. In the tumbling mill to which 60 mass % of aluminum oxide was input, the grain size measured by the use of a laser diffraction scattering method (for example, Microtrac 9320-X100 made by Nikkiso Co., Ltd.) was set to D50=1.0 to 1.3 more or less. In the tumbling mill to which 34 mass % of aluminum oxide was input, the grain size measured by the use of the same laser diffraction scattering method was set to D50=1.4 to 1.8 more or less.

These slurries were input to the tumbling mill along with the separately-pulverized sintering agents and were mixed, and a molding binder such as an acryl resin was added thereto and mixed, thereby obtaining a slurry. Here, the amount of the molding binder added was set to 4 to 8 mass % with respect to 100 mass % of the mixed powder.

The slurry in which the mixed powder and the molding binder were mixed was granulated by the use of a spray drier and a molded product was formed through the use of a known powder press molding method.

In order to sinter the molded product, a firing process was performed in the range of 1420° C. to 1650° C. using an electric furnace, whereby ceramics substrate samples for mounting a light-emitting element of Sample Nos. 1 to 13 with a thickness of 0.63±0.05 mm and with the crystal grain size distributions and the average crystal grain sizes shown in Table 1 were obtained.

The crystal grain size distribution, the reflectance, and the thermal conductivity of the resultant ceramics substrate samples for mounting a light-emitting element were measured using the following methods, and the relationship between the crystal grain size distribution in the ranges of 0.2 to 1 μm and 2 μm to 6 μm and the reflectance and thermal conductivity was evaluated.

In measurement of the crystal grain size distribution, a mirror-like finishing process was performed on the surfaces of the samples up to the depth of 30 μm from the surfaces, a fire etching process was performed on the processed surfaces at temperatures lower 80° C. than the firing temperatures of the samples, images were captured at a magnification of 3000 times with a scanning electron microscope to prepare image data, and the image data was converted into numerical values using an image analyzer. Specifically, the range of 835 μm$^2$ was analyzed using JSM-7001F made by JEOL Ltd. as the scanning electron microscope and Win ROOF made by MITANI Corporation as the image analyzer. Here, the crystal grain sizes of 0.2 μm or less in terms of the equivalent circle diameter were not distinguished from noise and thus were automatically deleted from the image data.

The reflectance was measured by using a spectral photometer with a model name of UV-315 and an integral sphere unit with a model name of ISR-3100, made by Shimadzu Corporation, using a 50 W halogen lamp and a deuterium lamp as a light source, setting the wavelength range to 200 to 1000 nm, setting the measurement range to diffuse reflectance (7×9 mm with a slit of 20 nm), and using barium sulfate powder as the standard without using a mask.

The thermal conductivity was measured by processing the ceramics substrates for mounting a light-emitting element into samples with a diameter of 10 mm and a thickness of 2 mm using the same materials as those specified in the respective Sample Nos. and using a laser flash method. Specifically, the measurement was performed using TC-7000 made by Shinku Riko Kabushiki Kaisha as the measuring instrument on the basis of JIS R 1611-1997.

In comprehensive evaluation of the samples, a sample of which the reflectance values at wavelengths of 400 nm and 600 nm were 86% or more or 90% or more and the thermal conductivity was 17/W (m·K) or more was defined as "excellent" and was marked as A, a sample satisfying two conditions was defined as "good" and was marked as B, and a sample satisfying any one condition was defined as "acceptable" and was marked as C.

The evaluation results are shown in Table 1.

TABLE 1

| Sample No. | Crystal grain size distribution (%) Crystal grain size of a | | | Average crystal grain size μm | Reflectance | | Thermal conductivity W/(m·K) | Comprehensive evaluation |
|---|---|---|---|---|---|---|---|---|
| | 1 μm ≥ a | 2 μm ≤ a ≤ 6 μm | 6 μm < a | | 400 nm % | 600 nm % | | |
| 1 | 38 | 17 | 1.2 | 1.4 | 79.8 | 84.8 | 24 | C |
| 2 | 41 | 13 | 0.5 | 1.3 | 83.1 | 87.6 | 22 | C |
| 3 | 45 | 13 | 0.7 | 1.3 | 86.6 | 90.7 | 21 | A |
| 4 | 52 | 9 | 0.7 | 1.2 | 87.5 | 91.2 | 19 | A |
| 5 | 66 | 8 | 0.7 | 1.1 | 88.8 | 91.4 | 17 | A |
| 6 | 80 | 6 | 0.5 | 1.0 | 89.6 | 91.7 | 17 | A |
| 7 | 84 | 6 | 0.5 | 1.0 | 91.7 | 92.3 | 15 | B |
| 8 | 54 | 3 | 0.0 | 1.1 | 90.3 | 91.3 | 16 | B |
| 9 | 55 | 5 | 0.5 | 1.2 | 89.5 | 91.3 | 17 | A |
| 10 | 57 | 9 | 0.7 | 1.2 | 88.1 | 91.3 | 19 | A |
| 11 | 53 | 11 | 0.6 | 1.2 | 87.0 | 91.0 | 20 | A |
| 12 | 56 | 15 | 0.2 | 1.2 | 86.2 | 90.5 | 21 | A |
| 13 | 55 | 18 | 0.2 | 1.3 | 82.9 | 87.6 | 22 | C |

As could be seen from the results shown in Table 1, first, regarding the reflectance, since the ratio of the number of crystal grains having a crystal grain size of 0.2 μm to 1.0 μm in terms of an equivalent circle diameter was 45% or more and less than 80% and the ratio of the number of crystal gains having a crystal grain size of 2.0 μm to 6.0 μm in terms of an equivalent circle diameter was in the range of 5% to 15%, Sample Nos. 3 to 6 and 9 to 12 were evaluated as A. In comparison with Sample Nos. 1, 2, and 13, since the amount of interface 7 between the crystal grains 4 and the glass phases, from which incident light 12 is reflected, in the substrate 1 increases and the absorption or attenuation of short-wavelength components of visible light by the crystal grains can be suppressed, the reflectance at 400 nm was 86% or more, the reflectance at 600 nm was 90% or more, and the reflectance tended to increase.

Regarding the thermal conductivity, since the ratio of the number of crystal grains having a crystal grain size of 0.2 μm to 1.0 μm in terms of an equivalent circle diameter was 45% or more and less than 80% and the ratio of the number of crystal gains having a crystal grain size of 2.0 μm to 6.0 μm in terms of an equivalent circle diameter was in the range of 5% to 15%, Sample Nos. 3 to 6 and 9 to 12 were evaluated as A. It can be seen that the amount of interface 7 between the crystal grains and the glass phases 5 scattering phonon decreased in comparison with Sample Nos. 7 and 8 and the thermal conductivity tended to increase to 17 W/(m·K) or higher.

Example 2

The influence of a crystal grain size distribution of 6 μm or more on the reflectance was evaluated.

The ceramics substrate 1 for mounting a light-emitting element was manufactured in the same way as Example 1. At this time, the grain size of the slurry and the firing temperature were adjusted so as to include crystal grains with a crystal grain size of 6 μm or more in terms of an equivalent circle diameter, whereby ceramics substrate samples for mounting a light-emitting element of Sample Nos. 14 to 20 were obtained.

The same method as Example 1 was used to measure the reflectance, a sample of which the reflectance values at wavelengths of 400 nm and 600 nm were 86% or more or 90% or more was defined as "excellent" and was marked as A, a sample satisfying any one condition was defined as "good" and was marked as B, and a sample not satisfying any condition was defined as "acceptable" and was marked as C. The evaluation results are shown in Table 2.

TABLE 2

| Sample No. | Crystal grain size distribution (%) Crystal grain size of a | | | | Average crystal grain size μm | Reflectance | | Comprehensive evaluation |
|---|---|---|---|---|---|---|---|---|
| | 0.2 μm < a ≤ 1 μm | 1 μm < a < 2 μm | 2 μm ≤ a ≤ 6 μm | 6 μm < a | | 400 nm % | 600 nm % | |
| 14 | 55 | 30.3 | 11.9 | 2.8 | 1.4 | 82.0 | 89.5 | C |
| 15 | 55 | 30.4 | 11.9 | 2.7 | 1.4 | 83.8 | 90.0 | B |
| 16 | 52 | 32.3 | 13.6 | 2.1 | 1.4 | 84.3 | 90.1 | B |
| 17 | 55 | 34.4 | 9.0 | 1.6 | 1.3 | 84.9 | 90.2 | B |
| 18 | 53 | 34.0 | 12.0 | 1.0 | 1.3 | 85.5 | 90.3 | B |
| 19 | 54 | 36.0 | 10.0 | 0.0 | 1.3 | 88.1 | 91.0 | A |
| 20 | 52 | 36.0 | 12.0 | 0.0 | 1.3 | 86.9 | 91.2 | A |

As could be seen from the results shown in Table 2, since the ratio of the number of crystal grains having a crystal grain size of more than 6 μm in terms of an equivalent circle diameter in Sample No. 14 was more than 2.7%, light incident on the ceramics substrate for mounting a light-emitting element easily passed through the crystal grains and exited from the rear surface, the reflectance at a wavelength of 600 nm was slightly less than 90%, and the reflectance at a wavelength of 400 nm was less than 86%. In Sample Nos. 15 to 18, since the ratio of the number of crystal grains with a crystal grain size of more than 6 μm in terms of an equivalent circle diameter was in the range of 1% to 2.7%, light incident on the ceramics substrate for mounting a light-emitting element easily passed through the crystal grains and exited from the rear surface, the reflectance at a wavelength of 600 nm was slightly more than 90%, and the reflectance at a wavelength of 400 nm was less than 86%. On the contrary, in Sample Nos. 19 to 20, since the ratio of the number of crystal grains with a crystal grain size of more than 6 μm in terms of an equivalent circle diameter was 0%, a sufficient amount of interface 7 reflecting light incident on the ceramics substrate for mounting a light-emitting element existed and the reflectance at a wavelength of 600 nm which can increase reflected light was 91% or more which was high. Since the number of large crystal grains absorbing or attenuating short-wavelength components was small, the reflectance at a wavelength of 400 nm was 88.1% or more and the reflectance could be easily maintained in a high value.

Example 3

The influence of the average crystal grain size on the reflectance and the thermal conductivity was evaluated.

The ceramics substrates for mounting a light-emitting element were manufactured in the same way as Example 1. The substrates 1 were manufactured by adjusting the grain size of the slurry and the firing temperature so that the crystal grain size in terms of an equivalent circle diameter satisfied the values shown in Table 3, whereby ceramics substrate samples for mounting a light-emitting element of Sample Nos. 21 to 27 were obtained.

The same measurement methods and the same comprehensive evaluation of the samples as Example 1 were used.

The results are shown in Table 3.

TABLE 3

| Sample No. | Crystal grain size distribution (%) | | | Average crystal grain size μm | Reflectance | | Thermal conductivity W/(m · K) | Comprehensive evaluation |
|---|---|---|---|---|---|---|---|---|
| | 1 μm ≥ a | 2 μm ≤ a ≤ 6 μm | 6 μm < a | | 400 nm % | 600 nm % | | |
| 21 | 45 | 15 | 1.0 | 1.5 | 86.2 | 90.0 | 23 | A |
| 22 | 53 | 9 | 0.5 | 1.3 | 88.5 | 91.3 | 21 | A |
| 23 | 60 | 8 | 0.5 | 1.2 | 88.9 | 91.4 | 20 | A |
| 24 | 71 | 7 | 0.4 | 1.1 | 89.5 | 91.5 | 20 | A |
| 25 | 74 | 5 | 0.1 | 0.8 | 90.3 | 91.6 | 18 | A |
| 26 | 78 | 5 | 0.1 | 0.7 | 90.9 | 92.1 | 17 | A |
| 27 | 80 | 5 | 0.1 | 0.6 | 91.4 | 92.5 | 17 | A |

As could be seen from the results shown in Table 3, in Sample Nos. 22 to 27, since the average crystal grain size was 1.3 μm or less, a sufficient amount of grain boundary 7 reflecting light incident on the ceramics substrate for mounting a light-emitting element existed, the amount of interface 7 with the glass phases 5 scattering phonon decreased, the reflectance at a wavelength of 600 nm was 91% or more, and the thermal conductivity was 17 W/(m·K) which was high. Accordingly, it could be seen that both characteristics could be satisfied.

Example 4

The influence of the grain boundary phases 5 formed between the crystal grains on the reflectance was evaluated. The ceramics substrate 1 for mounting a light-emitting element was manufactured in the same way as Example 1. At this time, the substrate 1 was manufactured by adjusting the amount of sintering agent and the firing temperature so that the grain boundary phase 5 satisfy the values shown in Table 4, whereby ceramics substrates 1 for mounting a light-emitting element of Sample Nos. 28 to 31 were obtained.

The same reflectance measuring method as Example 1 was used. In measurement of the average width of grain boundary phases, a cross-section of the substrate 1 was enlarged to a magnification of 50000 times at an arbitrary point through the use of TEM observation and the width of the grain boundary phases was measured. The same measurement was performed on a viewing field of ten positions, and the widths of the grain boundary phases were measured and averaged to obtain the average width. The comprehensive evaluation of the samples was performed in the same way as Example 2.

The results are shown in Table 4.

TABLE 4

| Sample No. | Average width of grain boundary phases nm | Reflectance | | Comprehensive evaluation |
|---|---|---|---|---|
| | | 400 nm % | 600 nm % | |
| 28 | 2.5 | 85.8 | 91.0 | B |
| 29 | 2.0 | 87.9 | 91.8 | A |
| 30 | 1.6 | 88.7 | 91.9 | A |
| 31 | 1.2 | 89.6 | 92.2 | A |

As could be seen from the results shown in Table 4, in Sample Nos. 29 to 31, since the widths of the grain boundary phases 5 were 2 nm or less, the grain boundary phases with low thermal conductivity were thin, the reflection of light was repeated to increase the amount of diffusely-reflected light 13d, and thus the reflectance was easily raised. Accordingly, the state where the reflectance at a wavelength of 400 nm was 86% or more and the reflectance at a wavelength of 600 nm was 90% or more was satisfied.

As described above, it can be seen that the ceramics substrate 1 for mounting a light-emitting element according to the embodiment is a ceramics substrate 1 that is suitable for mounting a light-emitting element and that has high reflectance and high thermal conductivity.

The light-emitting device 21 in which the light-emitting element 2 is mounted on the ceramics substrate 1 for mounting a light-emitting element can efficiently reflect light emitted from the light-emitting element 2, and has superior heat dissipation performance due to high thermal conductivity, thereby easily suppressing degradation of the light-emitting element due to heat.

REFERENCE SIGNS LIST

1: Ceramics substrate for mounting a light-emitting element (Substrate)
1a: One surface; 1b: Other surface
2: Light-emitting element
3: Conductor
3a, 3b: Electrode pad; 3c:, 3d: Electrode (Front electrode); 3e, 3f: Penetrating conductor; 3g, 3h: Electrode (Rear electrode)
4: Crystal grain
5: Glass phase (Grain boundary phase)
6: Pore
7: Interface (Interface defined between crystal grain and glass phase)
8: Interface (Interface defined between pore and glass phase)
9: Range of grain boundary phase
11: Incident light
12: Transmitted light
13: Reflected light
13a: Specularly-reflected light; 13b: Diffusely-reflected light; 13c: Specularly-reflected light; 13d: Diffusely-reflected light; 13e: Specularly-reflected light; 13f: Diffusely-reflected light
21: Light-emitting device
31: Sealing member
31a: Lens
32: Bonding wire

The invention claimed is:

1. A ceramics substrate for mounting a light-emitting element comprising a ceramic sintered body which contains a total of 6 mass % or less of silicon oxide, calcium oxide and magnesium oxide, the ceramics substrate having a mounting section on which the light-emitting element is mounted, in a surface portion on a mounting section side of the ceramics substrate, out of crystal grains having a crystal grain size of 0.2 μm or more in equivalent circle diameter, a ratio of a number of crystal grains having a crystal grain size of 0.2 μm to 1.0 μm in equivalent circle diameter being in a range of 45% to 80%, a ratio of a number of crystal gains having a crystal grain size of 2.0 μm to 6.0 μm in equivalent circle diameter being in a range of 5% to 15%, and a ratio of a number of crystal grains having a crystal grain size of more than 6.0 μm in equivalent circle diameter being 2.7% or less.

2. The ceramics substrate for mounting a light-emitting element according to claim 1, wherein the ceramic sintered body contains 94 mass % or more of aluminum oxide.

3. The ceramics substrate for mounting a light-emitting element according to claim 1, wherein a maximum value of the crystal grain size is 6.0 μm or less.

4. The ceramics substrate for mounting a light-emitting element according to claim 1, wherein an average crystal grain size is in a range of 0.7 μm to 1.3 μm in equivalent circle diameter.

5. The ceramics substrate for mounting a light-emitting element according to claim 1, wherein the ceramic sintered body has a grain boundary phase formed between the crystal grains and an average width of the grain boundary phase is 2 nm or less.

6. A light-emitting device, comprising:
the ceramics substrate for mounting a light-emitting element according to claim 1; and
a light-emitting element mounted on the ceramics substrate.

* * * * *